(12) United States Patent
Kim

(10) Patent No.: US 12,250,865 B2
(45) Date of Patent: *Mar. 11, 2025

(54) DISPLAY DEVICE

(71) Applicant: LG Display Co., Ltd., Seoul (KR)

(72) Inventor: Hyeongseok Kim, Paju-si (KR)

(73) Assignee: LG Display Co., Ltd. (KR)

( * ) Notice: Subject to any disclaimer, the term of this patent is extended or adjusted under 35 U.S.C. 154(b) by 528 days.

This patent is subject to a terminal disclaimer.

(21) Appl. No.: 17/137,276

(22) Filed: Dec. 29, 2020

(65) Prior Publication Data

US 2021/0202614 A1    Jul. 1, 2021

(30) Foreign Application Priority Data

Dec. 31, 2019 (KR) .......................... 10-2019-0179740

(51) Int. Cl.
*H01L 27/32* (2006.01)
*H10K 59/121* (2023.01)
*H10K 59/122* (2023.01)
*H10K 59/88* (2023.01)

(52) U.S. Cl.
CPC .......... *H10K 59/88* (2023.02); *H10K 59/121* (2023.02); *H10K 59/122* (2023.02)

(58) Field of Classification Search
CPC ........................ H01L 27/3223; H01L 27/3246
See application file for complete search history.

(56) References Cited

U.S. PATENT DOCUMENTS

| | | | | |
|---|---|---|---|---|
| 2014/0183501 A1* | 7/2014 | Kim | .................... | H10K 59/1315 438/34 |
| 2015/0034935 A1* | 2/2015 | Choi | .................... | H10K 50/844 257/40 |
| 2016/0284770 A1* | 9/2016 | Kim | .................... | H10K 50/844 |
| 2018/0083077 A1* | 3/2018 | Lee | .................... | H10K 59/122 |
| 2019/0305221 A1 | 10/2019 | Hou | | |
| 2020/0227661 A1* | 7/2020 | Nishikiori | .............. | H10K 71/13 |
| 2021/0202615 A1* | 7/2021 | Kim | .................... | H01L 27/3246 |

FOREIGN PATENT DOCUMENTS

| | | |
|---|---|---|
| CN | 110071140 A | 7/2019 |
| KR | 10-2015-0021169 A | 3/2015 |

OTHER PUBLICATIONS

Chinese Office Action dated Nov. 13, 2023 issued in Patent Application No. 202011434397.7 w/English Translation (11 pages).
Office Action in Korean Appln. No. 20190179740, mailed on Nov. 14, 2024, 14 pages (with English translation).

* cited by examiner

*Primary Examiner* — Vu A Vu
*Assistant Examiner* — Valerie N Newton
(74) *Attorney, Agent, or Firm* — Fish & Richardson P.C.

(57) ABSTRACT

A display device includes a substrate including a display area provided with pixels disposed therein and a non-display area surrounding the display area and provided with a dummy pattern disposed therein; a light emitting layer formed on the pixels and the dummy pattern; and a bank surrounding the light emitting layer, wherein the dummy pattern includes: a first dummy part extending along a horizontal direction; a second dummy part extending along a vertical direction; and a third dummy part provided by extending the first dummy part and the second dummy part in a corner area where the first dummy part and the second dummy part are connected to each other and having a pattern protruding in an outer direction of the substrate.

20 Claims, 17 Drawing Sheets

DISPLAY DEVICE

CROSS-REFERENCE TO RELATED APPLICATION

This application claims the benefit of Korean Patent Application No. 10-2019-0179740 filed on Dec. 31, 2019, which is hereby incorporated by reference in its entirety.

BACKGROUND

Field of the Disclosure

The present disclosure relates to a display device that prevents a light emission non-uniformity problem of pixels due to dewetting.

Description of the Background

As the information society evolves, various types of display devices have been developed. Recently, various display devices such as a liquid crystal display (LCD), a plasma display panel (PDP), and an organic light emitting display (OLED) have been utilized.

The organic light emitting element constituting an organic light emitting display is a self-luminous type, and does not require a separate light source, thereby reducing thickness and weight of a display device. In addition, the organic light emitting display exhibits high quality properties such as low power consumption, high luminance, and high response speed.

Recently, a technique for forming a light emission layer of an organic light emitting element through a solution process using an inkjet device has been developed. The solution process is performed in a way of applying a solution to a preset area to form a light emitting layer and then dry the solution. At this time, the light emission layer may not be properly formed in the pixels provided in an outer part due to dewetting which occurs in the outer part of the solution, thereby causing pixel defects.

SUMMARY

Accordingly, the present disclosure provides a display device including a dummy pattern formed on an outer part of a display area where pixels are disposed and a light emission layer formed from the display area to the dummy pattern through a solution process to prevent the light emission non-uniformity problem of pixels due to the dewetting.

Various exemplary aspects of the present disclosure provide the display device that prevents the solution from being dewetted in a direction from the dummy pattern to the pixels, by using aggregation properties of the solution.

A display device includes a substrate including a display area provided with pixels disposed therein and a non-display area surrounding the display area and provided with a dummy pattern disposed therein; a light emitting layer formed on the pixels and the dummy pattern; and a bank surrounding the light emitting layer, wherein the dummy pattern includes: a first dummy part extending along a horizontal direction; a second dummy part extending along a vertical direction; and a third dummy part connecting the first dummy part and the second dummy part to each other and having a part protruding in an outer direction of the substrate.

The third dummy part may include a sawtooth pattern.

In the first dummy part, a width in the vertical direction of the first dummy part may gradually become wider toward a corner area.

In the second dummy part, a width in the horizontal direction of the second dummy part may gradually become wider toward the corner area.

The width in the vertical direction of the first dummy part may correspond to a width in the vertical direction of two pixel rows, and the width in the horizontal direction of the second dummy part may correspond to a width in the horizontal direction of one pixel column.

The dummy pattern may further include a bar-shaped partition wall disposed inside the third dummy part, and extending along an inclined direction at a predetermined angle to the horizontal direction.

The dummy pattern may further include a cylindrical partition wall disposed in a center of inside the third dummy part, and having a predetermined radius.

The dummy pattern may further include a bar-shaped partition wall disposed inside the first dummy part, and extending along the horizontal direction.

BRIEF DESCRIPTION OF THE DRAWINGS

The accompanying drawings, which are included to provide a further understanding of the disclosure and are incorporated in and constitute a part of this specification, illustrate aspects of the disclosure and together with the description serve to explain the principles of the disclosure.

In the drawings.

DETAILED DESCRIPTION

Figure 1:
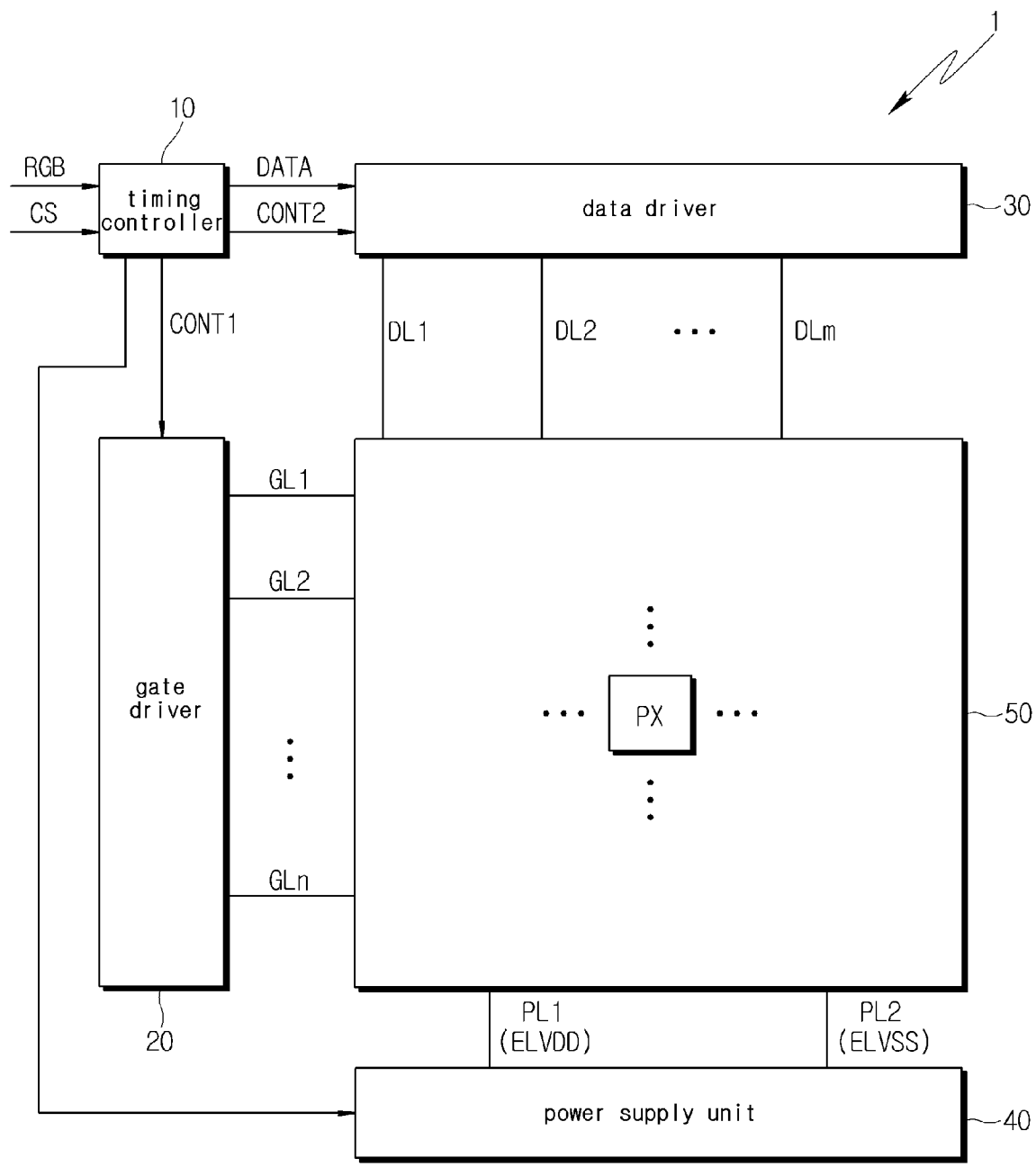
FIG. 1 is a block diagram showing a configuration of a display device according to an exemplary aspect of the present disclosure.

Hereinafter, exemplary aspects will be described with reference to the drawings. In this specification, when a first component (or area, layer, part, etc.) is referred to as being "on", "connected to", or "coupled with" a second component, it means that the first component can be directly connected to/coupled with the second component, or a third component can be disposed between the first and second components.

The same reference numerals refer to the same components. In addition, in the drawings, the thickness, proportion, and dimensions of the components are exaggerated for effective description of the technical content. "And/or" includes all combinations of one or more of which the associated configurations may be defined.

Although the terms "first", "second", etc. may be used herein to describe various components, these components should not be limited by these terms. These terms are only used for the purpose of distinguishing one component from another component. For example, the first component may be referred to as a second component without departing from the scope of the present exemplary aspects, and similarly, the second component may be referred to as a first component. As used herein, the singular forms are intended to include the plural forms as well, unless the context clearly indicates otherwise.

The terms "below", "on a lower side", "above", "on an upper side", etc. are used to describe the association of the components shown in the drawings. The terms are relative concepts and are explained based on the directions indicated in the drawings.

It will be further understood that the terms "comprise", "include", "have", etc. specify the presence of stated features, integers, steps, operations, elements, components, and/or combinations of them but do not preclude the presence or addition of one or more other features, integers, steps, operations, elements, components, and/or combinations thereof.

FIG. 1 is a block diagram showing a configuration of a display device according to an exemplary aspect.

Referring to FIG. 1, the display device 1 includes a timing controller 10, a gate driver 20, a data driver 30, a power supply unit 40, and a display panel 50.

The timing controller 10 may receive an image signal RGB and a control signal CS from the outside. The image signal RGB may include a plurality of gray scale data. The control signal CS may include, for example, a horizontal synchronization signal, a vertical synchronization signal, and a main clock signal.

The timing controller 10 processes the image signal RGB and the control signal CS to be suitable for operating conditions of the display panel 50, thereby generating and outputting image data, a gate drive control signal CONT1, a data drive control signal CONT2, and a power supply unit control signal CONT3.

The gate driver 20 may be connected to pixels PX of the display panel 50 through a plurality of gate lines GL1 to GLn, where n is a natural number greater than 1. The gate driver 20 may generate gate signals on the basis of the gate drive control signal CONT1 output from the timing controller 10. The gate driver 20 may provide the generated gate signals to the pixels PX through the plurality of gate lines GL1 to GLn.

The data driver 30 may be connected to the pixels PX of the display panel 50 through a plurality of data lines DL1 to DLm, where m is a natural number greater than 1. The data driver 30 may generate data signals on the basis of the image data and the data drive control signal CONT2 output from the timing controller 10. The data driver 30 may provide the generated data signals to the pixels PX through the plurality of data lines DL1 to DLm.

In various exemplary aspects, the data driver 30 may be further connected to the pixels PX of the display panel 50 through a plurality of sensing lines (or reference lines) (not shown). The data driver 30 may provide a reference voltage (or a sensing voltage, an initialization voltage) to the pixels PX through the plurality of sensing lines, or may sense states of the pixels PX on the basis of the electrical signal fed back from the pixels PX.

The power supply unit 40 may be connected to the pixels PX of the display panel 50 through a plurality of power lines PL1 and PL2. The power supply unit 40 may generate a driving voltage to be provided to the display panel 50 on the basis of the power supply unit control signal CONT3. The driving voltage may include, for example, a high potential driving voltage ELVDD and a low potential driving voltage ELVSS. The power supply unit 40 may provide the generated driving voltages ELVDD and ELVSS to the pixels PX through the corresponding power lines PL1 and PL2.

A plurality of pixels PX (or referred to as sub-pixels) is disposed on the display panel 50. The pixels PX may be disposed in a matrix form on the display panel 50, for example.

Each pixel PX may be electrically connected to a corresponding gate line and data line. These pixels PX may emit light with luminance corresponding to the gate signal and the data signal, which are respectively supplied through the gate lines GL1 to GLn and the data lines DL1 to DLm.

Each pixel PX may display any one of the first to third colors. In an exemplary aspect, each pixel PX may display any one of red, green, and blue colors. In another exemplary aspect, each pixel PX may display any one of cyan, magenta, and yellow colors. In various exemplary aspects, the pixels PXs may be configured to display any one of four or more colors. For example, each pixel PX may also display any one of red, green, blue, and white colors.

The timing controller 10, the gate driver 20, the data driver 30, and the power supply unit 40 may be each composed of a separate integrated circuit (IC) or by an integrated circuit in which at least a part thereof is combined. For example, at least one of the data driver 30 and the power supply unit 40 may be composed of an integrated circuit combined with the timing controller 10.

In addition, although the gate driver 20 and the data driver 30 are shown as separate components from the display panel 50 in FIG. 1, at least one of the gate driver 20 and the data driver 30 may be constituted in the in panel method formed integrally with the display panel 50. For example, the gate driver 20 may be integrally formed with the display panel 50 according to the gate in panel (GIP) method.

Figure 2:
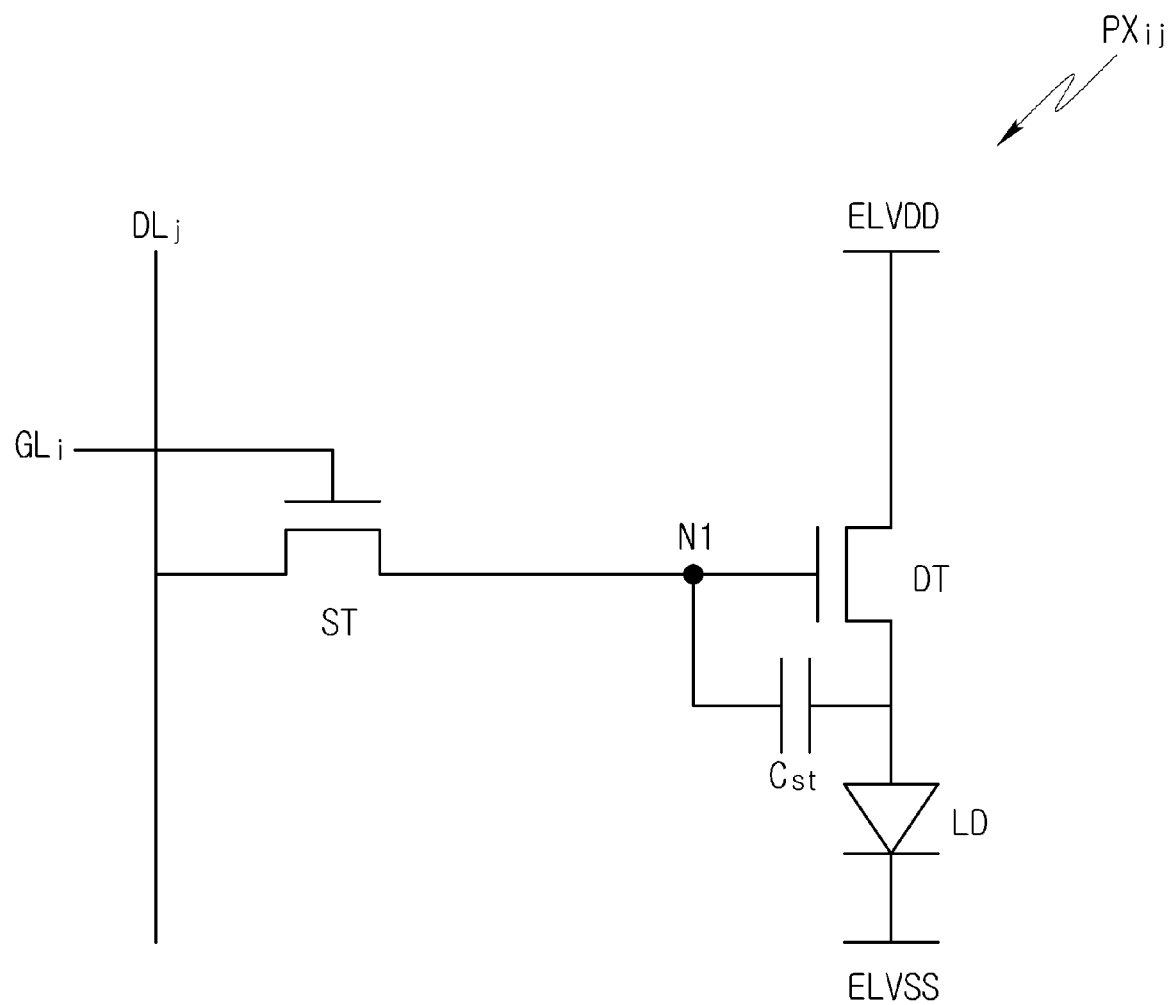
FIG. 2 is a circuit diagram showing the exemplary aspect of a pixel shown in FIG. 1.

FIG. 2 is a circuit diagram showing an exemplary aspect of the pixel shown in FIG. 1. FIG. 2 shows an example of a pixel PXij connected to the i-th gate line GLi and j-th data line DLj, where i is a natural number equal or greater than 1 and equal or smaller than n, and j is a natural number equal or greater than 1 and equal or smaller than m.

Referring to FIG. 2, the pixel PXij includes a switching transistor ST, a driving transistor DT, a storage capacitor Cst, and a light emitting element LD.

The first electrode (e.g., source electrode) of the switching transistor ST is electrically connected to the j-th data line DLj, and the second electrode (e.g., drain electrode) is electrically connected to the first node N1. The gate electrode of the switching transistor ST is electrically connected to the i-th gate line GLi. The switching transistor ST is turned on when a gate-on level gate signal is applied to the i-th gate line GLi, and transmits a data signal applied to the j-th data line DLj to the first node N1.

The first electrode of the storage capacitor Cst is electrically connected to the first node N1, and the second electrode may be configured to receive a high potential driving voltage ELVDD. The storage capacitor Cst may charge a voltage corresponding to a difference between the voltage applied to the first node N1 and the high potential driving voltage ELVDD.

The first electrode (e.g., source electrode) of the driving transistor DT is provided with a high potential driving voltage ELVDD, and the second electrode (e.g., drain electrode) is electrically connected to a first electrode (e.g., anode electrode) of the light emitting element LD. The gate electrode of the driving transistor DT is electrically connected to the first node N1. The driving transistor DT is turned on when the voltage of the gate-on level is applied through the first node N1, and may control the amount of driving current flowing through the light emitting element LD in response to the voltage provided to the gate electrode.

The light emitting element LD outputs light corresponding to the driving current. The light emitting element LD may output light corresponding to any one of red, green, blue, and white colors. The light emitting element LD may be an organic light emitting diode (OLED), or an ultra-small inorganic light emitting diode having a size ranging from micro to nanoscale, but the present exemplary aspect is not limited thereto. Hereinafter, the technical idea of the present exemplary aspect will be described with reference to the exemplary aspect in which the light emitting element LD is formed of an organic light emitting diode. A second electrode (e.g., cathode electrode) of the light emitting element LD is provided with a low potential driving voltage ELVSS.

In the present exemplary aspect, the structure of the pixels PXij is not limited to that shown in FIG. 2. According to the exemplary aspect, the pixels PXij compensate for a threshold voltage of the driving transistor DT, or may further include at least one element for initializing the voltage of the gate electrode of the driving transistor DT and/or the voltage of the anode electrode of the light emitting element LD.

FIG. 2 shows an example in which the switching transistor ST and the driving transistor DT are NMOS transistors, but the present exemplary aspect is not limited thereto. For example, at least some or all of the transistors constituting each pixel PXij may be composed of PMOS transistors. In various exemplary aspects, each of the switching transistor ST and the driving transistor DT may be implemented by a low temperature polysilicon (LTPS) thin film transistor, an oxide thin film transistor, or a low temperature polycrystalline oxide (LTPO) thin film transistor.

Figure 3:
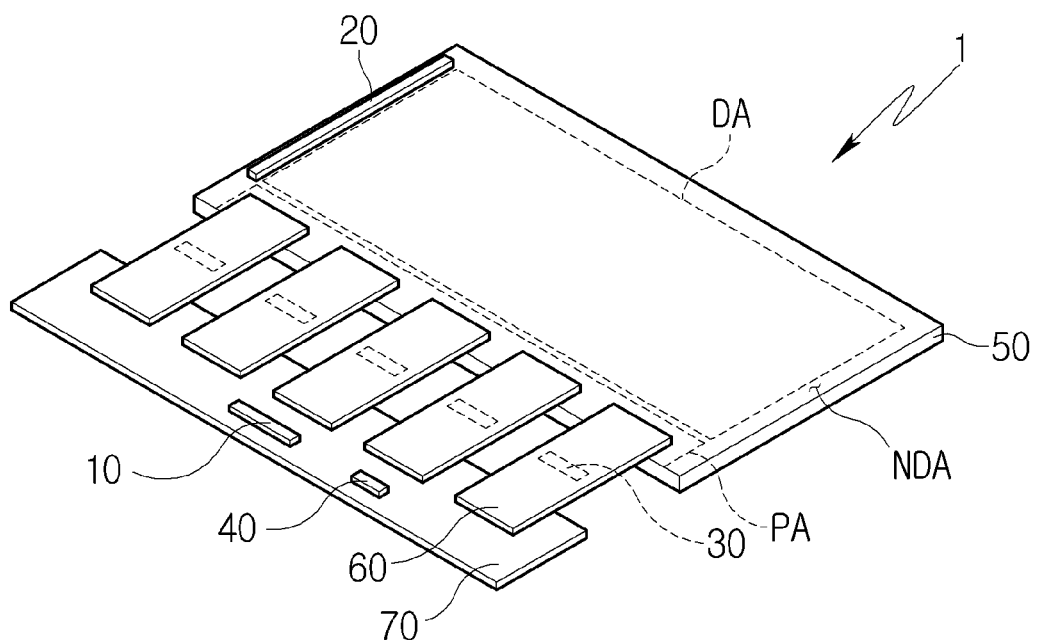
FIG. 3 is a schematic perspective view of the display panel shown in FIG. 1.

FIG. 3 is a schematic perspective view of the display panel shown in FIG. 1. Referring to FIG. 3, in association with FIGS. 1 and 2, components of the display device 1 will be described in more detail.

The display device 1 may be implemented in various forms. For example, the display device 1 may be implemented in a rectangular plate shape. However, the present exemplary aspect is not limited thereto, and the display device 1 may have various shapes such as a square shape, a circular shape, an elliptical shape, and a polygonal shape, and a part of the corner may be formed as a curved surface or may have a shape in which thickness is changed in at least one area. In addition, all or part of the display device 1 may have flexibility.

The display panel 50 includes a display area DA and a non-display area NDA. The display area DA is an area in which the pixels PX are disposed, and may be referred to as an active area. The non-display area NDA may be disposed around the display area DA. For example, the non-display area NDA may be disposed along the border of the display area DA. The non-display area NDA may comprehensively refer to areas other than the display area DA on the display panel 50, and may be referred to as a non-active area.

As a driver for driving the pixels PX, for example, a gate driver 20 may be provided in the non-display area NDA. The gate driver 20 may be disposed adjacent to one side or both sides of the display area DA, in the non-display area NDA. As shown in FIG. 3, the gate driver 20 may be provided in a non-display area NDA of the display panel 50 in the gate in panel method. However, in another exemplary aspect, the gate driver 20 is made of a driving chip and mounted on a flexible film and the like, and may be attached to the non-display area NDA by a tape automated bonding (TAB) method.

A plurality of pads (not shown) may be provided in the non-display area NDA. The pads are not covered by an insulating layer, and are exposed outside the display panel 50 to be electrically connected to a data driver 30, a circuit board 70, etc., which will be described later.

The display panel 50 may include wirings for supplying electrical signals to the pixels PX. The wirings may include, for example, gate lines GL1 to GLn, data lines DL1 to DLm, and power lines PL1 and PL2.

The power lines PL1 and PL2 are electrically connected to the power supply unit 40 (or the timing controller 10) through the connected pads, and may provide the high potential driving power ELVDD and the low potential driving power ELVSS, provided from the power supply unit 40 (or the timing controller 10), to the pixels PX.

The flexible film 60 may have one end attached to a pad area PA of the display panel 50 and the other end attached to the circuit board 70, thereby electrically connecting the display panel 50 and the circuit board 70 to each other. The flexible film 60 may include a plurality of wirings for electrically connecting the pads provided in the pad area PA and the wirings of the circuit board 70 to each other. In an exemplary aspect, the flexible film 60 may be attached on the pads through an anisotropic conducting film (ACF).

When the data driver 30 is made of a driving chip, the data driver 30 may be mounted on the flexible film 60 in the chip on film (COF) or chip on plastic (COP) method. The data driver 30 may generate a data signal on the basis of the image data and the data drive control signal CONT2, which are received from the timing controller 10, and may output the data signal to the data lines DL1 to DLm through the connected pads.

A plurality of circuits implemented with driving chips may be mounted on the circuit board 70. The circuit board 70 may be a printed circuit board or a flexible printed circuit board, but the type of the circuit board 70 is not limited thereto.

The circuit board 70 may include the timing controller 10 and the power supply unit 40 mounted in the form of an integrated circuit. In FIG. 3, the timing controller 10 and the power supply unit 40 are shown as separate components, but the present exemplary aspect is not limited thereto. That is, in various exemplary aspects, the power supply unit 40 may be integrally provided with the timing controller 10 or the timing controller 10 may be configured to perform the function of the power supply unit 40.

Figure 4:
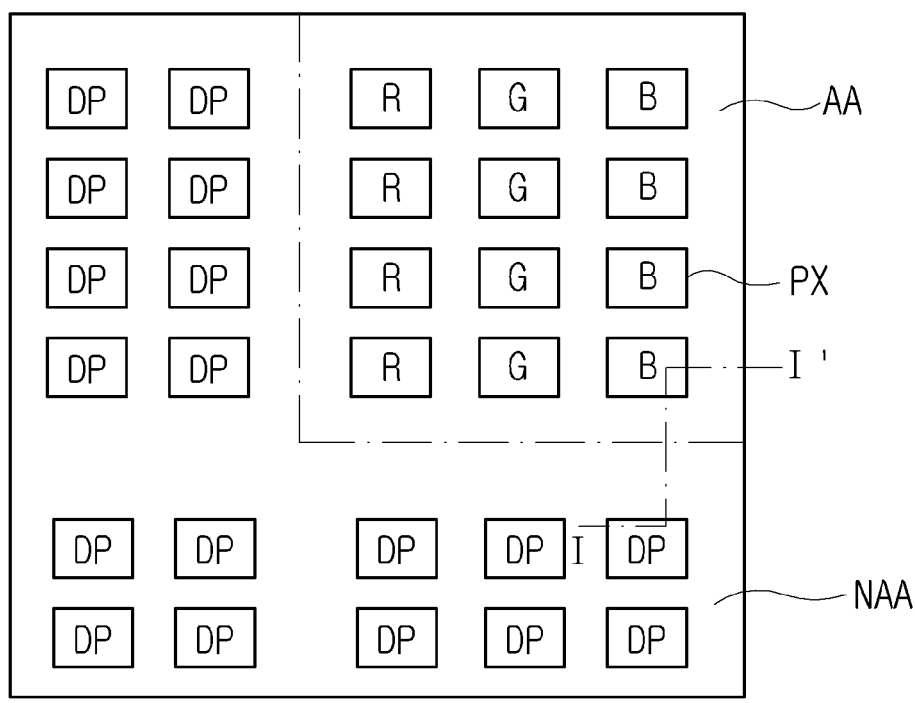
FIG. 4 is a schematic plan view of an enlarged part of a display area and a non-display area according to the present disclosure.
Figure 5:
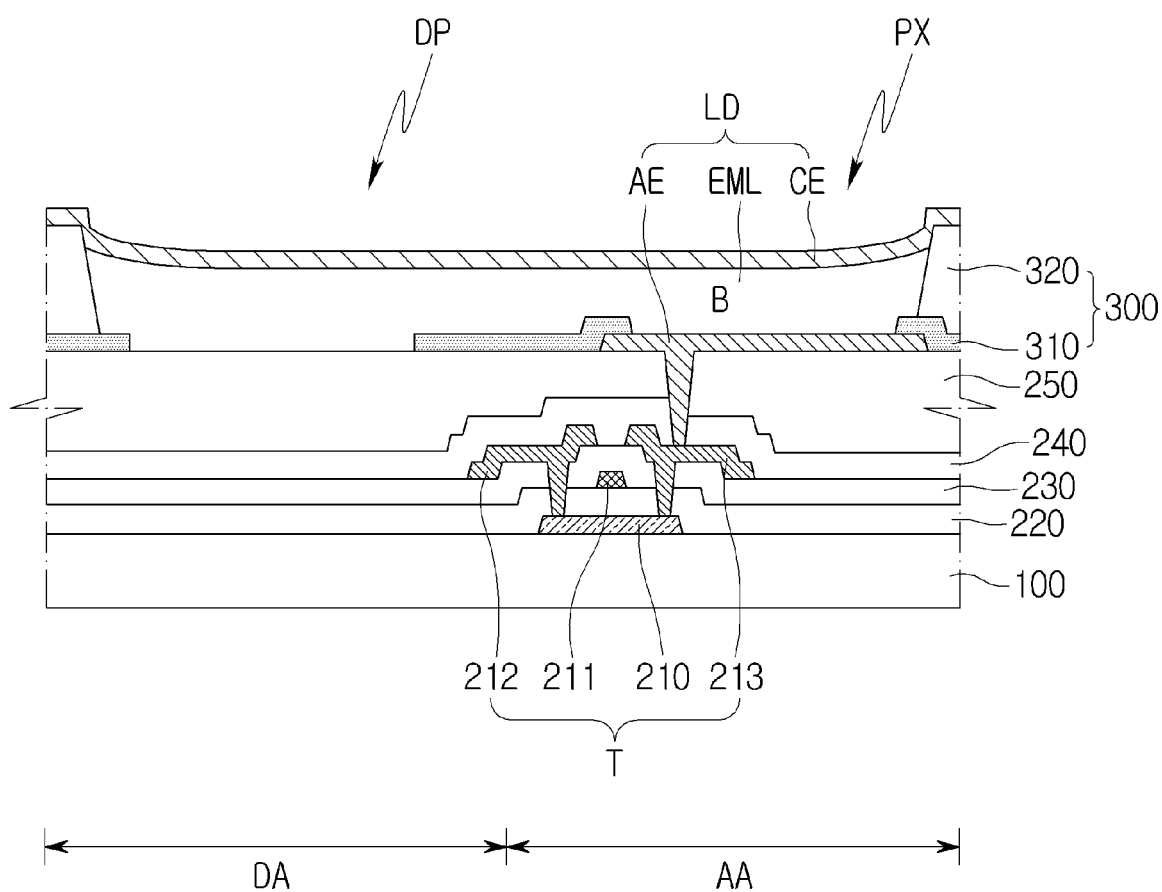
FIG. 5 is a cross-sectional view taken along line I-I' in FIG. 4.

FIG. 4 is a schematic plan view of an enlarged part of a display area and a non-display area according to an exemplary aspect. FIG. 5 is a cross-sectional view taken along line I-I' in FIG. 4.

Referring to FIG. 4, in the display area DA, the pixels PXs may be disposed in a matrix form by being arranged by a plurality of pixel rows and a plurality of pixel columns. At this time, the same pixels PX are disposed in one pixel column. In one pixel row, R, G, and B pixels may be repeatedly disposed in sequence (i.e., stripe type). However, the present exemplary aspect is not limited to the illustrated one, and in various other exemplary aspects, R, G, B, and G pixels may be repeatedly disposed in one pixel row in sequence (i.e., pentile type).

Dummy patterns DP may be formed in the non-display area NDA. The dummy patterns DP may be disposed in one or both ends of the pixel rows and pixel columns, which are disposed in the display area DA, in alignment with a corresponding pixel row and/or pixel column.

In FIG. 4, the dummy patterns DP are shown as having a square shape or a rectangular shape. However, the shape of the dummy patterns DP is not limited thereto. In various exemplary aspects described below, the dummy patterns DP may have a pattern in which a plurality of dummy patterns DP shown in FIG. 4 are merged.

Hereinafter, a laminated structure of the display panel 50 will be described.

Referring to FIG. 5, a substrate 100 is a base substrate of the display panel 50, and may be a translucent substrate. The substrate 100 may be a rigid substrate including glass or tempered glass, or a flexible substrate made of plastic.

In an exemplary aspect, a buffer layer (not shown) may be formed on the substrate 100. The buffer layer may prevent ions or impurities from diffusing from the substrate 100, and may block moisture penetration.

The substrate 100 may include a display area DA and a non-display area NDA. A circuit element layer and a light emitting element layer may be formed on the display area DA on the substrate 100.

The circuit element layer may include circuit elements (e.g., a switching transistor ST, a driving transistor DT, a storage capacitor Cst, etc.) and signal lines composing the pixel PXij. When a buffer layer is formed, the circuit element layer may be formed on the buffer layer.

First, an active pattern 210 may be provided on the substrate 100. The active pattern 210 may be provided of a silicon-based semiconductor material or an oxide-based semiconductor material.

A gate insulating layer 220 may be formed on the active pattern 210, and a gate electrode 211 may be provided on the gate insulating layer 220. An interlayer insulating layer 230 may be formed on the gate electrode 211, and a source electrode 212 and a drain electrode 213 may be provided on the interlayer insulating layer 230. The source electrode 212 and the drain electrode 213 may be connected to the active pattern 210 through a contact hole passing through the interlayer insulating layer 230 and the gate insulating layer 220.

The source electrode 212, the drain electrode 213, the gate electrode 211, and the active pattern 210 corresponding thereto may compose the transistor T. The transistor T may be, for example, a driving transistor DT or a switching transistor ST. In FIG. 5, the driving transistor DT in which the drain electrode 213 is connected to a first electrode 261 of the light emitting element LD is shown as an example.

A passivation layer 240 may be formed on the source electrode 212 and the drain electrode 213. The passivation layer 240 is an insulating layer for protecting the lower elements, and may be formed of an inorganic material or an organic material.

An overcoat layer 250 may be formed on the passivation layer 240. The overcoat layer 250 may be a planarization film for alleviating a level difference of an underlying structure.

Circuit elements such as various signal lines and capacitors (not shown) may be further provided on the circuit element layer. The signal lines may include, for example, a gate line GL, a data line DL, etc. described with reference to FIGS. 1 and 2.

The light emitting element layer is formed on the overcoat layer 250, and includes light emitting elements LD. The light emitting element LD includes a first electrode 261, a light emitting layer 262, and a second electrode 263. The first electrode 261 may be an anode electrode and the second electrode 263 may be a cathode electrode.

The first electrode 261 is provided on the overcoat layer 250. The first electrode 261 is connected to the drain electrode 213 of the transistor T through a via hole penetrating the overcoat layer 250 and the passivation layer 240.

A bank 300 is further provided on the overcoat layer 250. In the display area DA, the bank 300 may be provided to cover a part of the edge of the first electrode 261.

In various exemplary aspects, the bank 300 may be composed of a first bank 310 having hydrophilic properties and a second bank 320 having hydrophobic properties. The second bank 320 may be patterned through a photolithography process after applying a solution mixed a hydrophobic material such as fluorine with an organic insulating material having hydrophilicity. A hydrophobic material such as fluorine may move to an upper part of the second bank 320 by light emitted during the photolithography process, and the upper part of the second bank 320 may have hydrophobic properties. However, the present exemplary aspect is not limited thereto, and the entire part of the second bank 320 may be provided to have hydrophobic properties.

In an exemplary aspect, the first bank 310 is provided to have a smaller thickness than that of the second bank 320, and may be provided to have a wider width than that of the second bank 320. The first bank 310 may be disposed in a grid form to surround each pixel PX, and the second bank 320 may be disposed to surround each pixel column. When the light emitting layer 262 to be described later is formed by a solution process, the solution may be easily spread in the pixel column direction by the first bank 310 having hydrophilicity, and mixing of the solution in between the pixel columns may be prevented by the second bank 320 having hydrophobicity.

The light emitting layer 262 is formed on the first electrode 261. The light emitting layer 262 is not covered by the bank 300, and is formed on a part of the exposed first electrode 261. That is, the light emitting layer 262 is surrounded by the bank 300.

The light emitting layer 262 may have a multi-layer thin film structure including a light generating layer. For example, the light emitting layer 262 may include a hole transport layer (HTL), an organic light emitting layer, and an electron transport layer (ETL). In addition, the light emitting layer 262 may further include a hole injection layer (HIL), a hole blocking layer (HBL), an electron injection layer (EIL), and an electron blocking layer (EBL).

In the present exemplary aspect, the light emitting layer 262 may be formed by the solution process using an inkjet device, etc. In particular, the light emitting layer 262 may be formed in a single solution process for pixels PX of the same color, disposed in the same pixel column. In this exemplary aspect, the inkjet device may move on the first electrodes 261 disposed in the same pixel column, and drop the solutions. When the dropped solutions are dried, a single integrated light emitting layer 262 is formed for the pixel columns.

When the light emitting layer 262 is formed by the solution process, a difference in thickness may occur between the center area of the light emitting layer 262 and the edge area adjacent to the bank 300 by the tension force between the solution and the bank 300. For example, the light emitting layer 262 may be formed in a concave shape having the thinnest thickness in the center and the thickest thickness in the area in contact with the bank 300. However, the present exemplary aspect is not limited thereto. That is, in various other exemplary aspects, structures for improving thickness uniformity of the light emitting layer 262 may be disposed, and the light emitting layer 262 may have a uniform thickness in the entire area.

The second electrode 263 is provided on the light emitting layer 262 and the bank 300. That is, the second electrode 263 may be provided to cover the light emitting layer 262 and the bank 300.

Although not shown, an encapsulation layer may be formed on the second electrode 263. The encapsulation layer serves to prevent external moisture from penetrating the light emitting layer 262. The encapsulation layer may be formed of an inorganic insulating material, or may be formed of a structure in which inorganic insulating materials and organic insulating materials are alternately stacked, but is not limited thereto.

A circuit element layer, a light emitting layer 262, a second electrode 263, a bank 300, and an encapsulation layer may be provided on the non-display area NDA on the substrate 100.

The circuit element layer may have the same structure as the circuit element layer formed in the display area DA, and may be formed through the same single process. However, at least some or all of signal lines and circuit elements may not be provided in the circuit element layer in the non-display area NDA.

The bank 300 is provided on the overcoat layer 250 of the circuit element layer. In the non-display area NDA, the bank 300 may be a definition layer defining the shape of the dummy pattern DP.

The light emitting layer 262 is further formed on the overcoat layer 250. The light emitting layer 262 is formed on the overcoat layer 250 exposed without being covered by the bank 300. That is, the light emitting layer 262 is formed in the dummy pattern DP defined by the bank 300, and is surrounded by the bank 300.

Unlike the display area DA, the circuit element layer in the non-display area NDA is not provided with at least some or all of signal lines and circuit elements. In addition, as shown, the dummy pattern DP does not include the first electrode 261. Accordingly, the light emitting layer 262 composing the dummy pattern DP does not emit light.

The light emitting layer 262 of the dummy patterns DP may be formed by a single solution process with the light emitting layer 262 of corresponding pixel columns. The inkjet device moves along one pixel column from the display area DA to the non-display area NDA, and the solutions may be dropped to the pixels PX disposed in the corresponding pixel column and the dummy patterns DP disposed adjacent to the corresponding pixel column. Thereafter, when the dropped solutions are dried, the light emitting layer 262 may be integrally formed with respect to the pixels PX and the dummy patterns DP.

As described above, the thickness of the light emitting layer 262 may be different between the center area of the light emitting layer 262 and the edge area adjacent to the bank 300 by the tension force between the solution and the bank 300.

A second electrode 263 and an encapsulation layer may be provided on the light emitting layer 262. The second electrode 263 and the encapsulation layer may be provided through a single process with the same structure as the second electrode 263 and the encapsulation layer provided in the display area DA. That is, the second electrode 263 and the encapsulation layer may be provided in a structure extending from the display area DA to the non-display area NDA. However, in various exemplary aspects, the second electrode 263 may not be provided in the non-display area NDA.

In the structure of the display panel 50 as described above, the dummy pattern DP is provided to solve the light emission imbalance between the center part and the outer part of the pixel column in the display area DA. As described above, the light emitting layer 262 may be formed through a single solution process, for one pixel column and dummy patterns DP corresponding thereto. When the solution dries, dewetting may occur in which the solution retracts from the outer part thereof. When the degree of dewetting is large, pixel defects may occur, because the light emitting layer 262 is not correctly formed in predetermined pixels disposed on the outer part of the pixel column (i.e., both ends of the pixel column).

In order to prevent such a problem, the solution may be dropped to the dummy pattern DP over the pixel column area. Then, since the dewetting occurs in the dummy pattern DP, the pixel defects in the display area DA may be prevented.

The following exemplary aspects propose various forms of the dummy pattern DP that may more effectively prevent pixel defects, caused by dewetting, through the dummy pattern DP.

Figure 6:
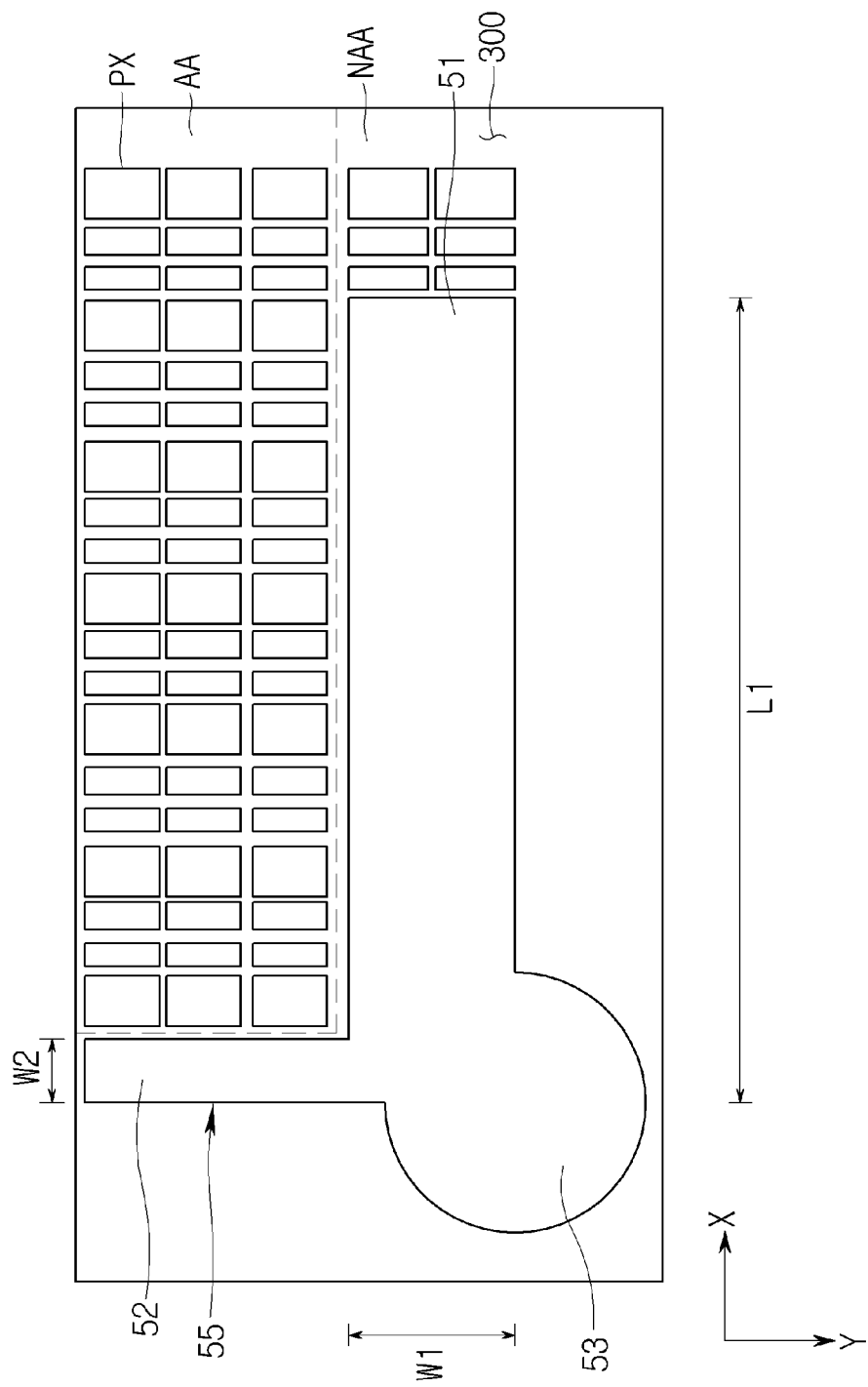
FIG. 6 is a plan view showing a dummy pattern according to a first exemplary aspect of the present disclosure.
Figure 7:
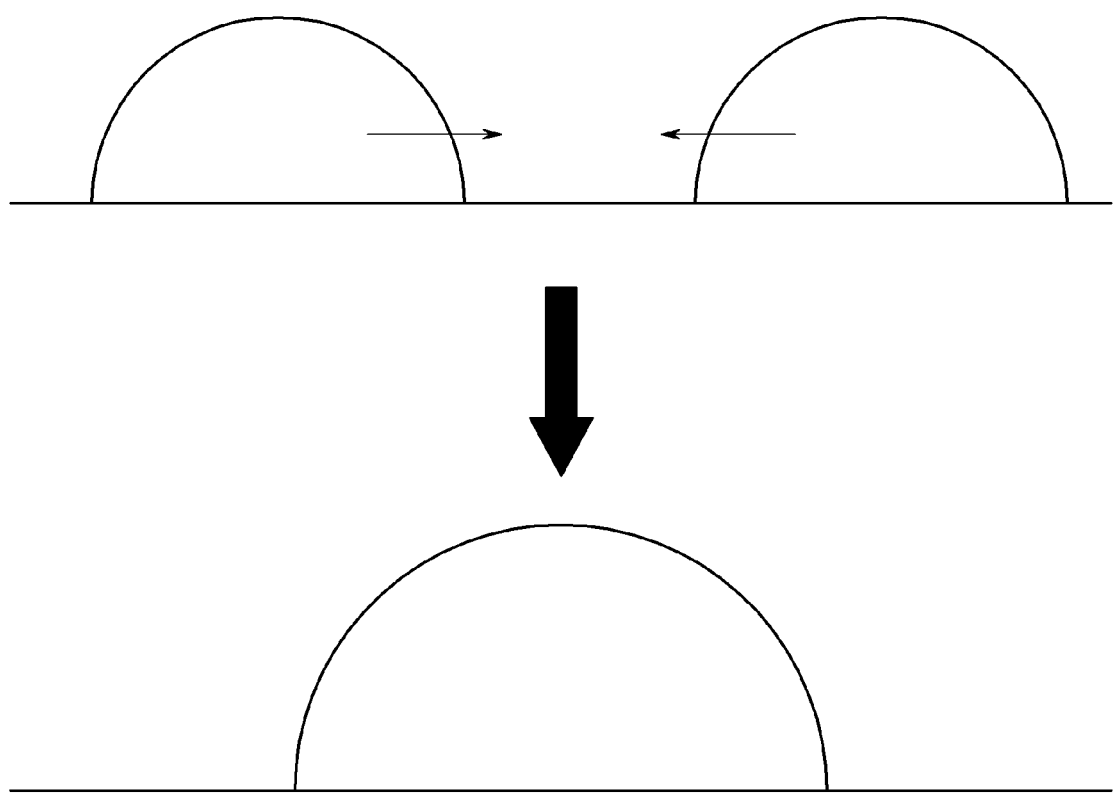
FIGS. 7 and 8 are views showing aggregation properties of a solution.
Figure 8:
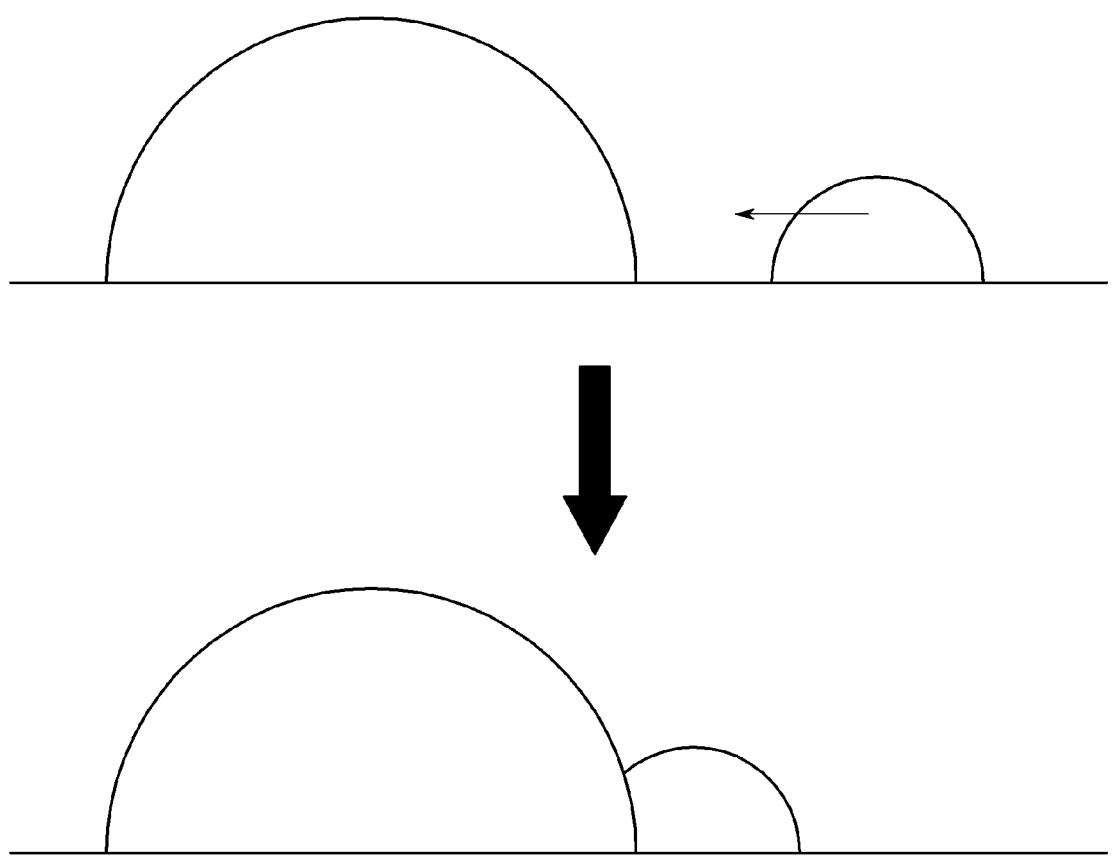
Figure 9:
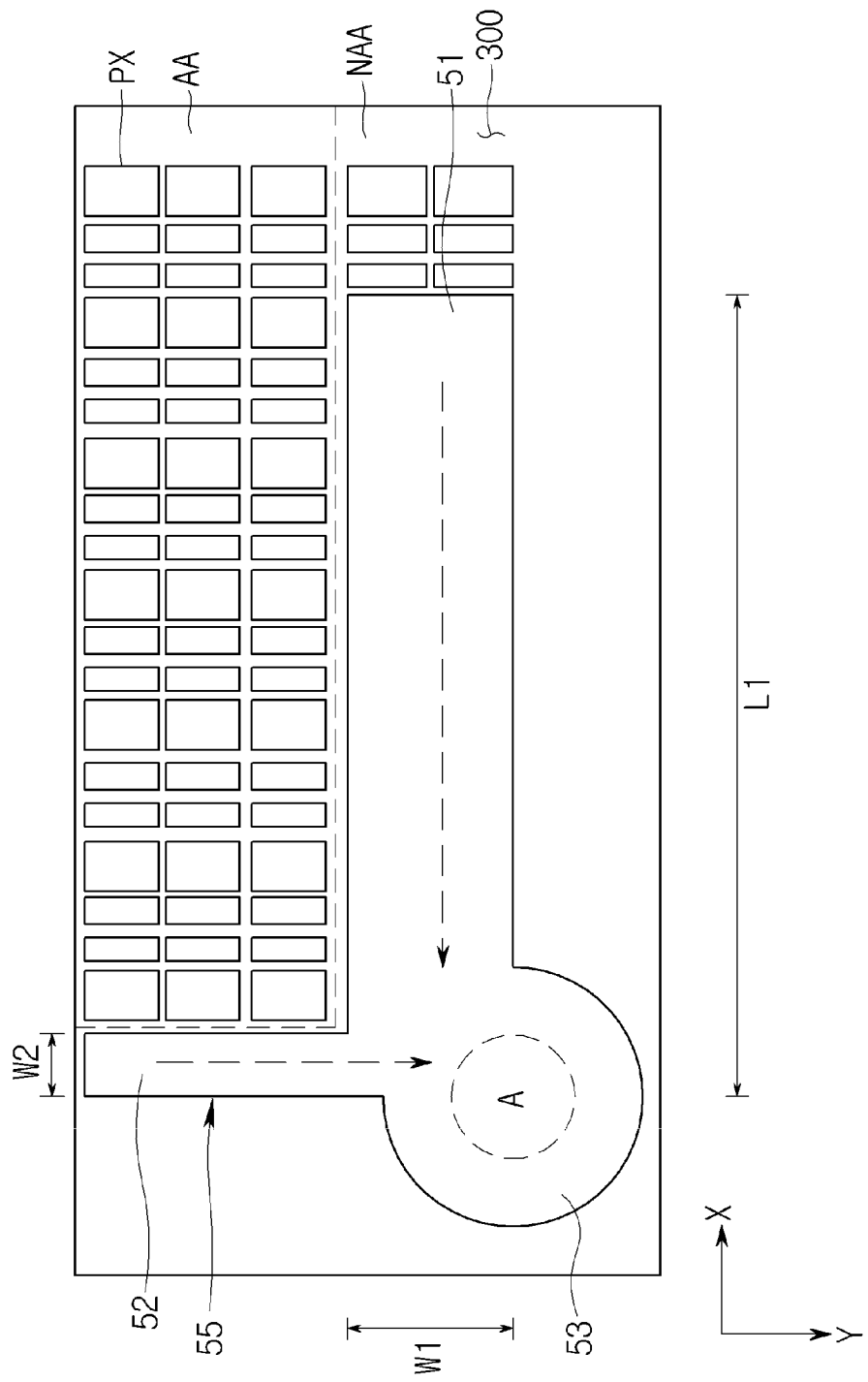
FIG. 9 shows an aggregation direction of the solution in the dummy pattern shown in FIG. 6.

FIG. 6 is a plan view showing a dummy pattern according to a first exemplary aspect. FIGS. 7 and 8 are views showing aggregation properties of the solution. FIG. 9 shows an aggregation direction of the solution in the dummy pattern shown in FIG. 6. In the drawing, the horizontal direction is the X-axis direction, and the vertical direction is the Y-axis direction.

Referring to FIG. 6, pixels PX in the display area DA are disposed in a matrix form aligned in the horizontal direction and the vertical direction.

In the non-display area NDA, the dummy pattern 55 includes a first dummy part 51 extending in the horizontal direction, a second dummy part 52 extending in the vertical direction, and a third dummy part 53 connecting the first dummy part 51 and the second dummy part 52 to each other and having a part protruding in an outer direction of the substrate.

The first dummy part 51 may have a bar-shaped extending along the horizontal. The width W1 in the vertical direction of the first dummy part 51 may be the same as or similar to the width in the vertical direction of two pixel rows. The first dummy part 51 may be extended to a length L1 corresponding to a plurality of pixel columns. The first dummy part 51 may be extended to a length L1 corresponding to all of the pixel columns or a part of the pixel columns, which are disposed in the display area DA.

The second dummy part 52 may have a bar-shaped extending along the vertical to an outer side of the display panel 50, that is, the substrate 100. The width W2 in the horizontal direction of the second dummy part 52 may be the same as or similar to the width in the horizontal direction of one pixel column. The second dummy part 52 may be extended to a length corresponding to a plurality of pixel rows. The second dummy part 52 may extend to a length corresponding to all of the pixel rows or a part of the pixel rows, which are disposed in the display area DA.

The third dummy part 53 is provided by extending the first dummy part 51 and the second dummy part 52 in a corner area where the first dummy part 51 and the second dummy part 52 are connected to each other, and has a pattern protruding in the outer direction of the substrate.

When the light emitting layer 262 is formed on the pixels PX through the solution process in the display area DA, the solutions are also dropped on the dummy pattern 55. For example, when first solutions for forming the red color light emitting layer 262 in a first pixel column are dropped, the first solutions are dropped from the display area DA to the dummy pattern 55 along the first pixel column; when second solutions for forming the green color light emitting layer 262 in a second pixel column are dropped, the second solutions are dropped from the display area DA to the dummy pattern 55 along the second pixel column; and when third solutions for forming the blue color light emitting layer 262 in a third pixel column are dropped, the third solutions are dropped from the display area DA to the dummy pattern 55 along the third pixel column. The first to third solutions dropped on the dummy pattern 55 are combined to each other by the mutual tension force in the dummy pattern 55.

When the solutions are combined with each other, in the case where each amount of the solutions is the same as or similar to each other, the magnitude of the tension force between the solutions is similar. Thus, the solutions combined to each other at an intermediate point as shown in FIG. 7. However, when the amount of one solution is larger, the magnitude of tension force between the solutions is different. In this case, as shown in FIG. 8, a small amount of a solution moves in the direction of a large amount of a solution to be combined.

In the shown dummy pattern 55, the third dummy part 53 is provided by extending the first dummy part 51 and the second dummy part 52 in the corner area where the first dummy part 51 and the second dummy part 52 are connected to each other, and has a pattern protruding in the outer direction of the substrate. In the third dummy part 53 having the pattern protruding in the outer direction of the substrate, a larger amount of solutions is dropped than that amounts of the first dummy part 51 and the second dummy part 52.

Referring to FIG. 9, by the mutual tension force described above, the solutions dropped on the first dummy part 51 and the solutions dropped on the second dummy part 52 receive tension force in the direction of the third dummy part 53. Some of the solutions dropped on the first dummy part 51 may move in the direction of the third dummy part 53 to be combined with the solutions dropped on the third dummy part 53. In addition, some of the solutions dropped on the second dummy part 52 may move in the direction of the third dummy part 53 to be combined with the solutions dropped on the third dummy part 53.

More solutions are introduced into area A of the third dummy part 53 having the protruding pattern in the first dummy part 51. Therefore, the solutions receive tension force in the direction of area A in the first dummy part 51.

In the second dummy part 52 as well, more solutions are introduced into area A of the third dummy part 53 having the protruding pattern, in the same principle. Therefore, the solutions receive tension force in the direction of area A in the second dummy part 52.

As described above, by the shape of the dummy pattern 55, the solutions receive tension force in the direction of area A, that is, in the direction away from the display area DA. Accordingly, the largest amount of solution per area may be applied to area A of the third dummy part 53. When the solution is dried, the drying rate in area A where the amount of the solution is large is relatively slow. As the solution dries relatively slowly in area A adjacent to the outermost part of the display panel 50, dewetting in the direction of the display region DA may be prevented.

In an exemplary aspect, the dummy patterns 55 shown in FIG. 6 and the dummy patterns 55 shown in FIG. 4 may be provided by a combination on one display panel 50. However, the present exemplary aspect is not limited thereto.

Figure 10:
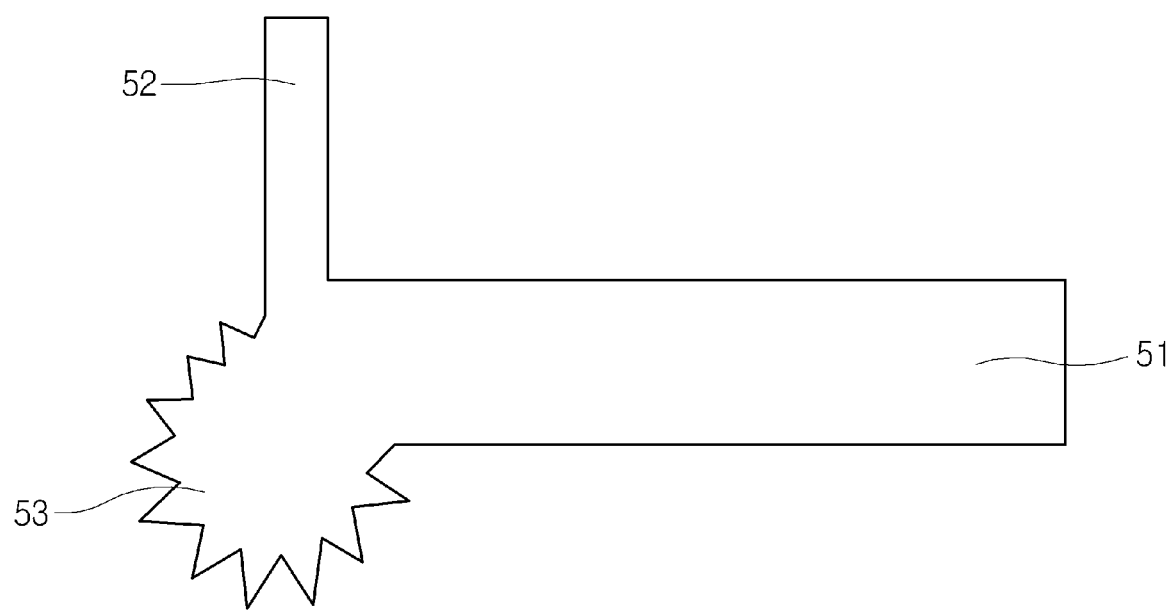
FIG. 10 is a plan view showing a dummy pattern according to a second exemplary aspect of the present disclosure.

FIG. 10 is a plan view showing a dummy pattern according to a second exemplary aspect. In the drawing, the horizontal direction is the X-axis direction, and the vertical direction is the Y-axis direction.

In comparison with the exemplary aspect shown in FIG. 6, in the second exemplary aspect, the third dummy part 53 of the dummy pattern includes a pattern for increasing a surface area.

As a pattern for increasing the surface area of the third dummy part 53, a plurality of triangular cross-sections, trapezoidal cross-sections, serrated shapes, or embossed patterns having elliptical patterns on one side may be provided. The surface area of the third dummy part 53 may be increased by the shapes of the dummy pattern 55. In the third dummy part 53 having a pattern protruding in the outer direction of the substrate, a larger amount of solutions than that of the first dummy part 51 and the second dummy part 52 is dropped. By the above-described mutual tension force, a part of the solutions dropped on the first dummy part 51 may move in the direction of the third dummy part 53 to be combined with the solutions dropped on the third dummy part 53. Some of the solutions dropped on the second dummy part 52 may move in the direction of the third dummy part 53 to be combined with the solutions dropped on the third dummy part 53. In the second exemplary aspect, since the third dummy part 53 of the dummy pattern includes a pattern for increasing the surface area, aggregation of the dropped solutions may occur more effectively in the third dummy part 53.

Figure 11:
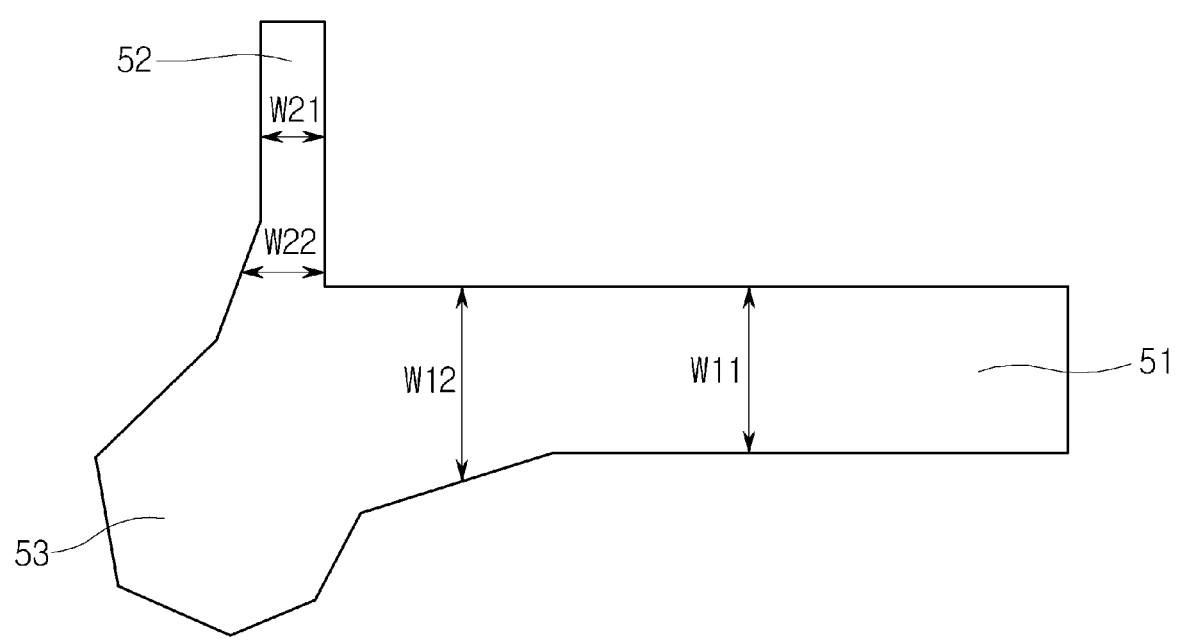
FIG. 11 is a plan view showing a dummy pattern according to a third exemplary aspect of the present disclosure.

FIG. 11 is a plan view showing a dummy pattern according to a third exemplary aspect. In the drawing, the horizontal direction is the X-axis direction, and the vertical direction is the Y-axis direction.

In comparison with the exemplary aspect shown in FIG. 6, in the dummy pattern in the third exemplary aspect, the width in the vertical direction of the first dummy part 51 gradually becomes wider toward the corner area. In addition, the width in the horizontal direction of the second dummy part 52 gradually becomes wider toward the corner area.

In the dummy pattern 51 in the third exemplary aspect, since the first dummy part 51 or the second dummy part 52 gradually becomes wider toward the corner area connected to the third dummy part 53, aggregation of the dropped solutions may occur more effectively in the third dummy part 53.

Figure 12:
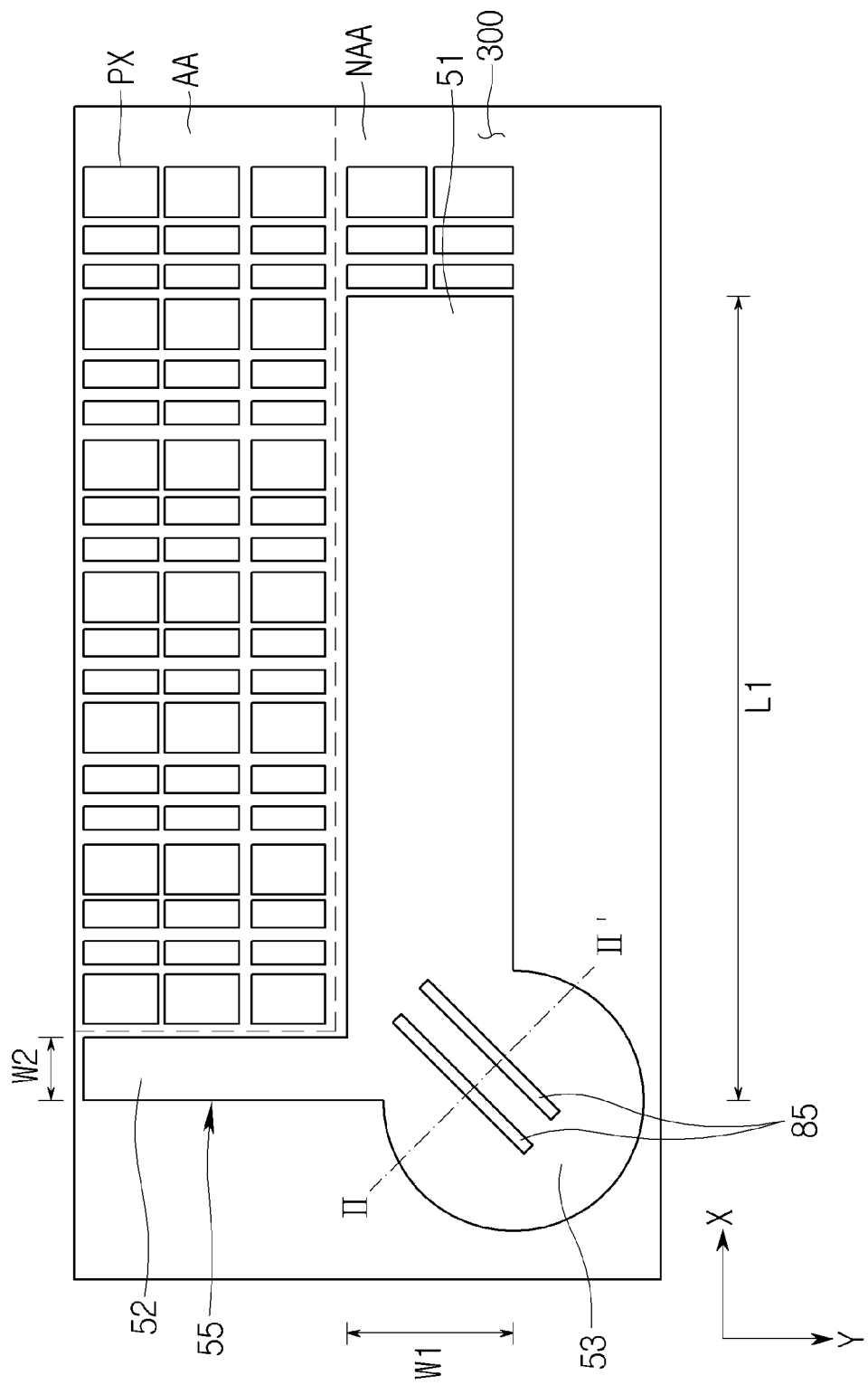
FIG. 12 is a plan view showing a dummy pattern according to a fourth exemplary aspect of the present disclosure.
Figure 13:
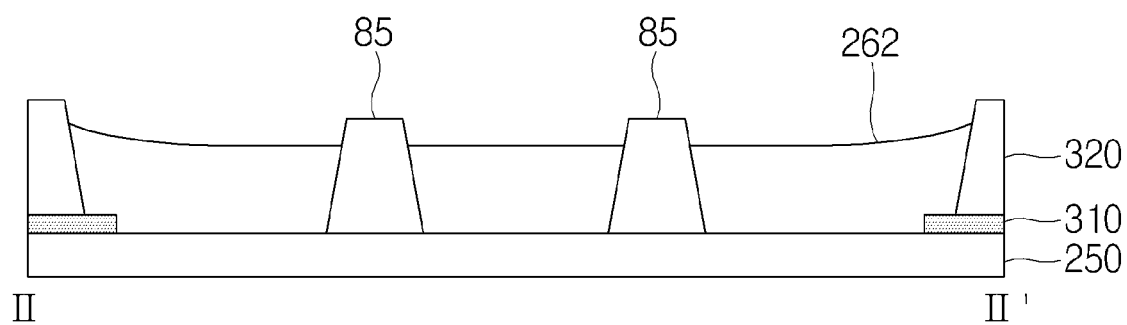
FIG. 13 is a cross-sectional view taken along line II-IF in FIG. 12.

FIG. 12 is a plan view showing a dummy pattern according to a fourth exemplary aspect. FIG. 13 is a cross-sectional view taken along line II-IF of FIG. 12. In the drawing, the horizontal direction is the X-axis direction, and the vertical direction is the Y-axis direction.

In comparison with the exemplary aspect shown in FIG. 6, the dummy pattern of the fourth exemplary aspect further includes a bar-shaped partition wall 85 disposed inside the third dummy part 53 and extending in a direction inclined at a predetermined angle with the horizontal direction. At least one partition wall 85 in the form of an extended bar may be disposed. When a plurality of extended bar-shaped partition walls 85 is disposed, the extended bar-shaped partition walls 85 may be disposed in parallel with a predetermined interval.

In an exemplary aspect, the partition wall 85 may have hydrophobic properties. When the partition wall 85 is hydrophobic, the partition wall 85 makes the tension force, between the partition wall 85 and the solution, relatively small. The partition wall 85 may function to reduce the area where the aggregated solution is positioned in the dummy pattern. Therefore, the partition wall 85 may determine the position where the solution is aggregated. That is, area Adjacent to the partition wall 85 having hydrophobicity may have less aggregated solution. Therefore, the aggregation of the solution may be more actively performed at a position separated by a predetermined distance away from the partition wall 85.

When the extended bar-shaped partition wall 85 as shown in FIG. 12 is disposed inside the third dummy part 53 along an inclined direction at a predetermined angle, the partition wall 85 may guide the position, where a solution is aggregated, toward the outside of the third dummy part 53, which is the outer direction of the substrate. Therefore, it is possible to more effectively prevent dewetting in the display area DA direction.

Figure 14:
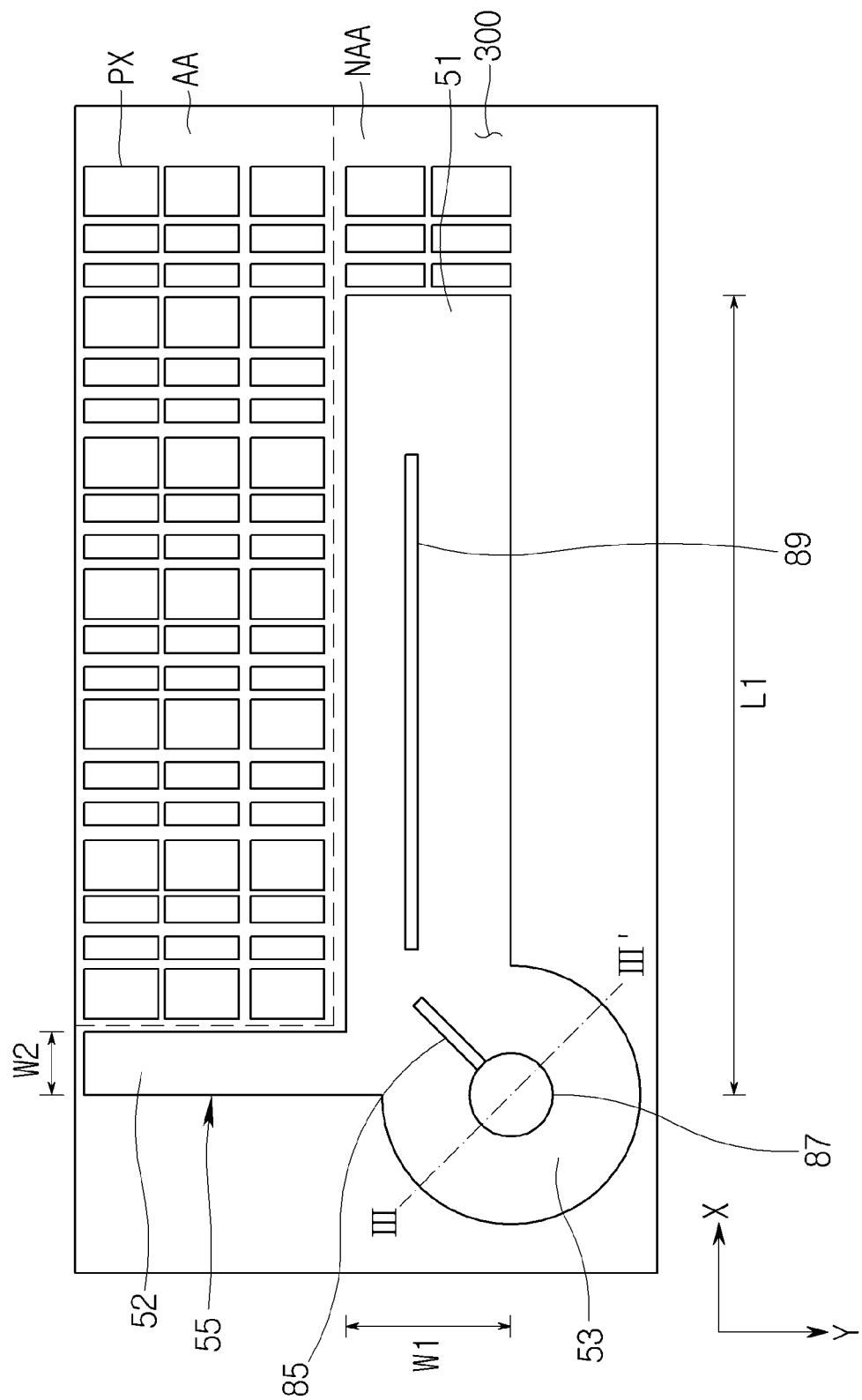
FIG. 14 is a plan view showing a dummy pattern according to a fifth exemplary aspect of the present disclosure.
Figure 15:
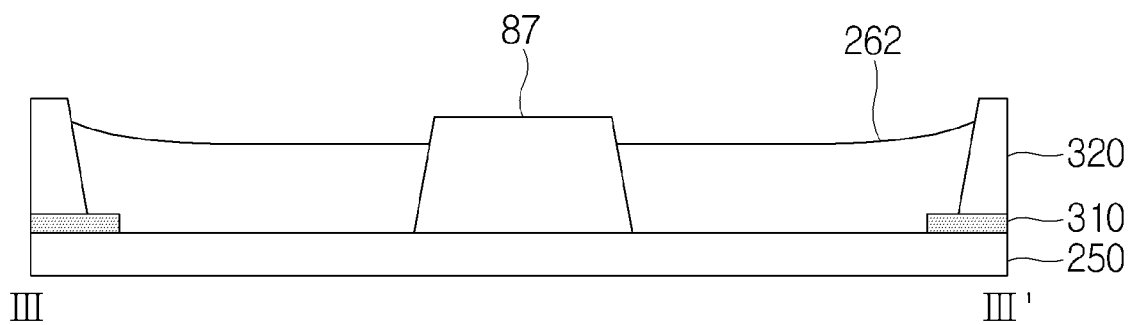
FIG. 15 is a cross-sectional view taken along line in FIG. 14.

FIG. 14 is a plan view showing a dummy pattern according to a fifth exemplary aspect. FIG. 15 is a cross-sectional view taken along line of FIG. 14. In the drawing, the horizontal direction is the X-axis direction, and the vertical direction is the Y-axis direction.

In comparison with the exemplary aspect shown in FIG. 6, the dummy pattern of the fifth exemplary aspect further includes a cylindrical partition wall 87 disposed inside the third dummy part 53 and having a predetermined radius. The cylindrical partition wall 87 may be disposed at the center of inside the third dummy part 53.

The partition wall 87 may have hydrophobic properties, and make the tension force between the partition wall 87 and the solution to be relatively small. The partition wall 87 may function to reduce the area where the aggregated solution is positioned in the dummy pattern. Therefore, the aggregation of the solution may be more actively performed at a position separated by a predetermined distance away from the partition wall 87.

As shown in FIG. 14, when the cylindrical partition wall 87 is disposed inside the third dummy part 53, the partition wall 87 may guide the position, where the solution is aggregated, toward the outside of the third dummy part 53, which is the outer direction of the substrate. Therefore, it is possible to more effectively prevent dewetting in the display area DA direction.

Figure 16:
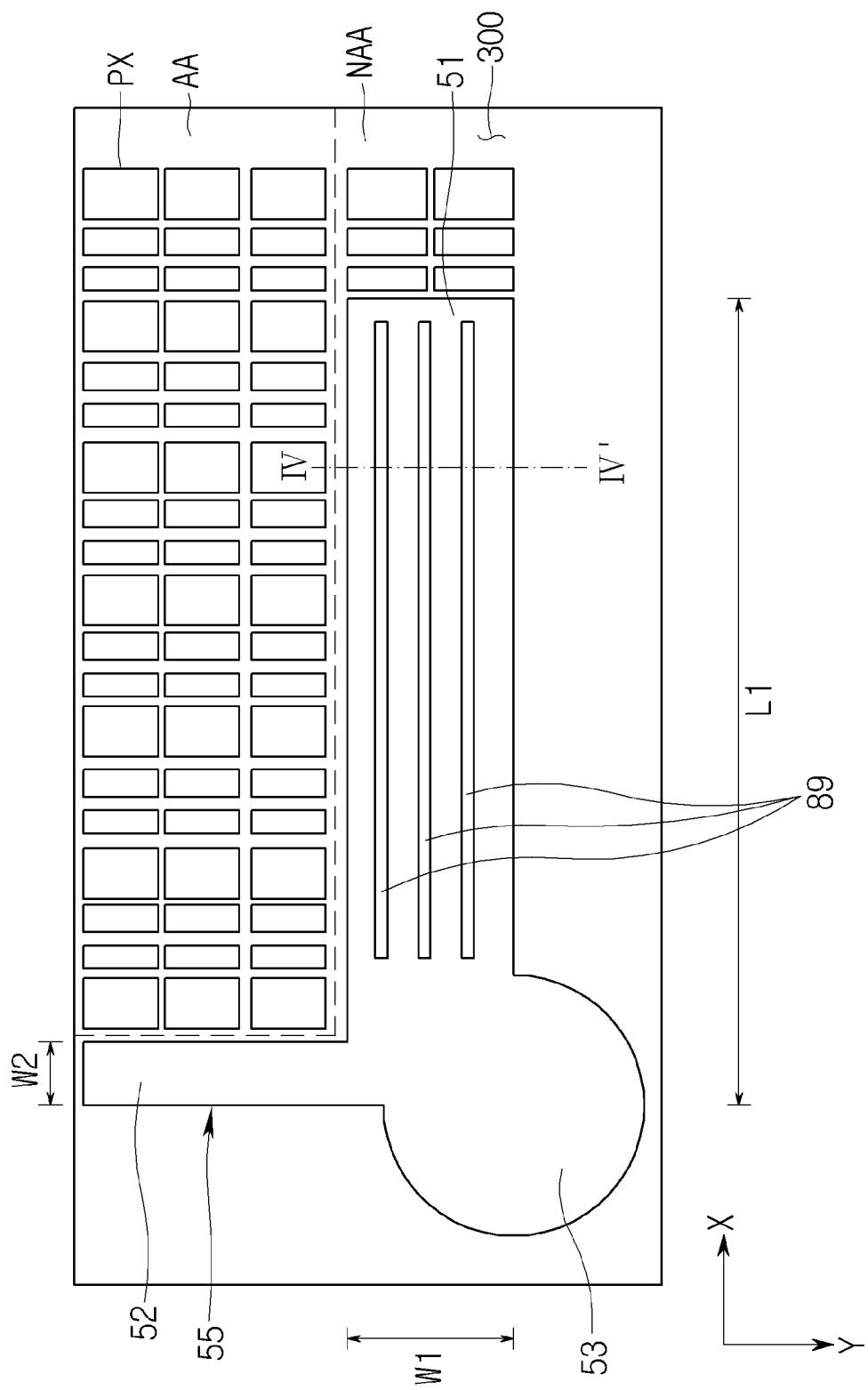
FIG. 16 is a plan view showing a dummy pattern according to a sixth exemplary aspect of the present disclosure.
Figure 17:
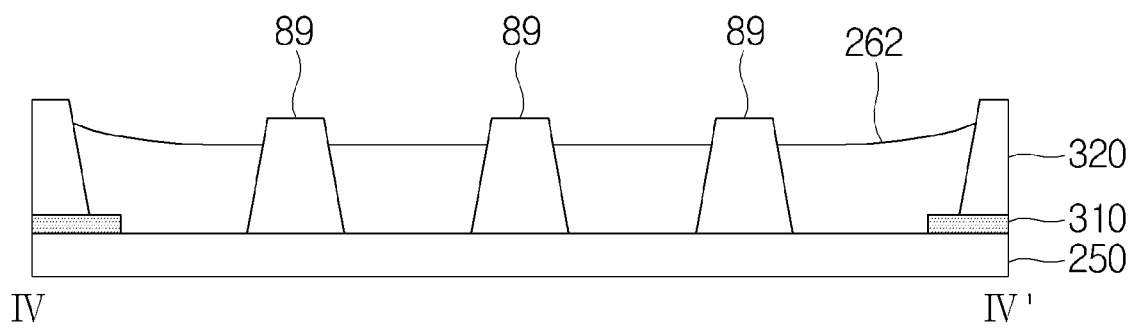
FIG. 17 is a cross-sectional view along line IV-IV' in FIG. 16.

FIG. 16 is a plan view showing a dummy pattern according to a sixth exemplary aspect. FIG. 17 is a cross-sectional view taken along line IV-IV' in FIG. 16. In the drawing, the horizontal direction is the X-axis direction, and the vertical direction is the Y-axis direction.

In comparison with the exemplary aspect shown in FIG. 6, the dummy pattern of the sixth exemplary aspect further includes a bar-shaped partition wall 89 disposed in the first dummy part 51 and extending along the horizontal direction. At least one partition wall 89 in the form of an extended bar may be disposed. When a plurality of extended bar-shaped partition walls 89 is disposed, the extended bar-shaped partition walls 89 may be disposed in parallel with a predetermined interval.

The partition wall 89 may have hydrophobic properties, and make the tension force between the partition wall 89 and the solution to be relatively small. The partition wall 89 may function to reduce the area where the aggregated solution is positioned in the dummy pattern. Therefore, aggregation of the solution may be more actively performed at a position separated by a predetermined distance away from the partition wall 89.

When the partition wall 89 in the form of a bar extending in the horizontal direction as shown in FIG. 16 is disposed inside the first dummy part 51, the partition wall 87 may reduce the area, where the aggregated solution is positioned, inside the first dummy part 51. The partition wall 87 may guide the position, where the solution is aggregated, toward the third dummy part 53, which is the outer direction of the substrate. Therefore, it is possible to more effectively prevent dewetting in the display area DA direction.

The exemplary aspects described above are to be understood in all respects as illustrative and not restrictive. The scope of the present disclosure is indicated by the following claims rather than the above detailed description, and all changes or modifications derived from the meaning and scope of the claims and equivalent concepts should be interpreted as being included in the claims of the present disclosure.

As described above, the display device according to various examples of the present disclosure may prevent pixel defects in the outer part due to dewetting that occurs in the outer part of the solution when the light emitting layer is formed using the solution process.

Although aspects have been described with reference to a number of illustrative aspects thereof, it should be understood that numerous other modifications and aspects can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A display device comprising:
   a substrate including a display area provided with pixels disposed therein and a non-display area surrounding the display area, wherein the non-display area is disposed at edges of the substrate and includes a first dummy pattern and a second dummy pattern to surround the non-display area;
   a light emitting layer disposed on the pixels, the first dummy pattern, and the second dummy pattern; and
   a bank surrounding the light emitting layer,
   wherein the second dummy pattern includes:
      a first dummy part extending along a horizontal direction;
      a second dummy part extending along a vertical direction; and a third dummy part connecting the first dummy part and the second dummy part with each other and having a part protruding in an outer direction of the substrate, wherein the light emitting layer is integrally formed with respect to the pixels, the first dummy pattern, and the second dummy pattern.

2. The display device of claim 1, wherein the third dummy part includes a sawtooth pattern.

3. The display device of claim 1, wherein, in the first dummy part, a width in the vertical direction of the first dummy part is gradually wider toward a corner area.

4. The display device of claim 1, wherein, in the second dummy part, a width in the horizontal direction of the second dummy part is gradually wider toward a corner area.

5. The display device of claim 1, wherein a width in the vertical direction of the first dummy part corresponds to a width in the vertical direction of two pixel rows, and a width in the horizontal direction of the second dummy part corresponds to a width in the horizontal direction of one pixel column.

6. The display device of claim 1, wherein the second dummy pattern further includes a bar-shaped partition wall disposed inside the third dummy part and extending along an inclined direction at a predetermined angle to the horizontal direction.

7. The display device of claim 1, wherein the second dummy pattern further includes a cylindrical partition wall disposed in a center of inside the third dummy part and having a predetermined radius.

8. The display device of claim 1, wherein the second dummy pattern further includes a bar-shaped partition wall disposed inside the first dummy part and extending along the horizontal direction.

9. The display device of claim 1, wherein the first dummy pattern is disposed adjacent to the second dummy pattern and formed adjacent to interior pixels of the display area.

10. The display device of claim 1, wherein the first dummy pattern comprises a plurality of pads corresponding to the pixels in a corresponding interior row or interior column.

11. The display device of claim 1, wherein the second dummy pattern is disposed at a corner of the display area and the first dummy pattern is adjacent to interior pixels of the display area, wherein the second dummy pattern is formed by merging pads of the first dummy pattern at the corner.

12. A display device comprising:
a substrate including a display area and a non-display area is disposed at edges of the substrate to surround the display area;
a plurality of pixels disposed in the display area;
a first dummy pattern in the non-display area;
a second dummy pattern in the non-display area comprising:
a first dummy part disposed in the non-display area and extending along a first direction;
a second dummy part disposed in the non-display area extending along a second direction; and
a third dummy part connected between the first dummy part and the second dummy part and having a part protruding in an outer direction of the substrate;
a light emitting layer is integrally formed with the pixels and the first, second and third dummy parts; and
a bank surrounding the light emitting layer,
wherein the first dummy part has a width greater than the second dummy part.

13. The display device of claim 12, wherein the third dummy part has a sawtooth pattern.

14. The display device of claim 12, wherein the first dummy part has a width in the second direction gradually increasing toward a corner area.

15. The display device of claim 12, wherein the second dummy part has a width in the first direction gradually increasing toward a corner area.

16. The display device of claim 12, wherein a width in the second direction of the first dummy part corresponds to a width in the second direction of two pixel rows.

17. The display device of claim 12, wherein a width in the second direction of the second dummy part corresponds to a width in the second direction of one pixel column.

18. The display device of claim 12, further comprising a bar-shaped partition wall disposed inside the third dummy part and extending along an inclined direction at a predetermined angle to the second direction.

19. The display device of claim 12, further comprising a cylindrical partition wall disposed in a center of inside the third dummy part.

20. The display device of claim 12, further comprising a bar-shaped partition wall disposed inside the first dummy part and extending along the second direction.

* * * * *